(12) United States Patent
Araki et al.

(10) Patent No.: US 8,461,050 B2
(45) Date of Patent: Jun. 11, 2013

(54) TAPER-ETCHING METHOD AND METHOD OF MANUFACTURING NEAR-FIELD LIGHT GENERATOR

(75) Inventors: Hironori Araki, Milpitas, CA (US); Yoshitaka Sasaki, Santa Clara, CA (US); Hiroyuki Ito, Milpitas, CA (US); Kazuki Sato, Milpitas, CA (US); Shigeki Tanemura, Milpitas, CA (US); Yukinori Ikegawa, Milpitas, CA (US)

(73) Assignee: Headway Technologies, Inc., Milpitas, CA (US)

( * ) Notice: Subject to any disclaimer, the term of this patent is extended or adjusted under 35 U.S.C. 154(b) by 111 days.

(21) Appl. No.: 13/157,938

(22) Filed: Jun. 10, 2011

(65) Prior Publication Data

US 2012/0315716 A1    Dec. 13, 2012

(51) Int. Cl.
  *H01L 21/311*    (2006.01)
(52) U.S. Cl.
  USPC    438/701; 438/31; 257/E21.249; 257/E21.231
(58) Field of Classification Search
  USPC    438/31, 40, 43, 673, 701, 713; 257/E21.249, 257/E21.231
  See application file for complete search history.

(56) References Cited

U.S. PATENT DOCUMENTS

| | | | |
|---|---|---|---|
| 2002/0136517 A1* | 9/2002 | Ruschin et al. | 385/132 |
| 2009/0139958 A1* | 6/2009 | Pentek et al. | 216/22 |
| 2009/0277870 A1* | 11/2009 | Sasaki et al. | 216/22 |
| 2010/0290323 A1* | 11/2010 | Isogai et al. | 369/13.24 |
| 2011/0303637 A1* | 12/2011 | Araki et al. | 216/24 |

* cited by examiner

*Primary Examiner* — William D Coleman
*Assistant Examiner* — Christine Enad
(74) *Attorney, Agent, or Firm* — Oliff & Berridge, PLC

(57) ABSTRACT

A method of taper-etching a layer to be etched that is made of $SiO_2$ or SiON and has a top surface. The method includes the step of forming an etching mask with an opening on the top surface of the layer to be etched, and the step of taper-etching a portion of the layer to be etched, the portion being exposed from the opening, by reactive ion etching so that a groove having two wall faces that intersect at a predetermined angle is formed in the layer to be etched. The etching mask is formed of a material containing elemental Al. The step of taper-etching employs an etching gas that contains a main component gas, which contributes to the etching of the layer to be etched, and $N_2$.

12 Claims, 8 Drawing Sheets

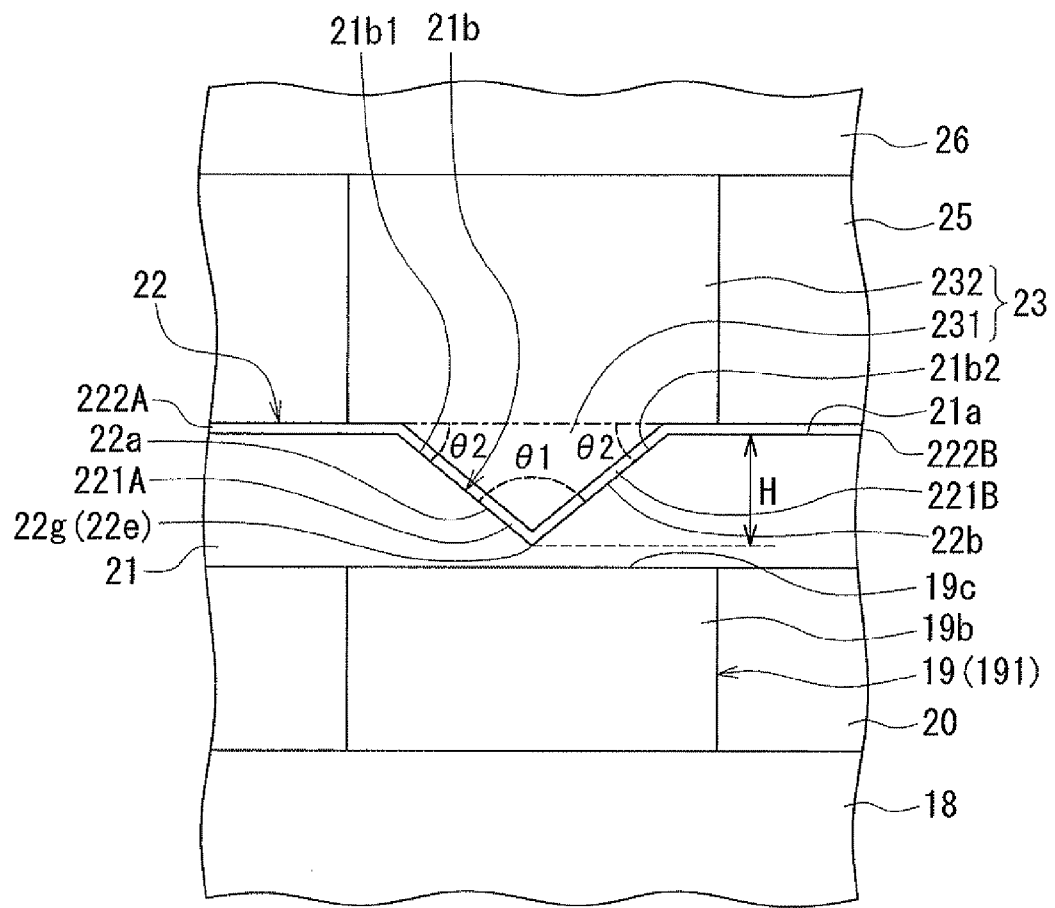
FIG. 1
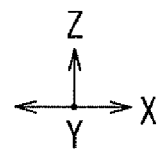

TAPER-ETCHING METHOD AND METHOD OF MANUFACTURING NEAR-FIELD LIGHT GENERATOR

BACKGROUND OF THE INVENTION

1. Field of the Invention

The present invention relates to a taper-etching method for forming a groove having a V-shaped cross section in an $SiO_2$ or SiON layer to be etched, and to a method of manufacturing a near-field light generator using the taper-etching method.

2. Description of the Related Art

Recently, magnetic recording devices such as magnetic disk drives have been improved in recording density, and thin-film magnetic heads and recording media of improved performance have been demanded accordingly. Among the thin-film magnetic heads, a composite thin-film magnetic head has been used widely. The composite thin-film magnetic head has such a structure that a read head including a magnetoresistive element (hereinafter, also referred to as MR element) for reading and a write head including an induction-type electromagnetic transducer for writing are stacked on a substrate. In a magnetic disk drive, the thin-film magnetic head is mounted on a slider that flies slightly above the surface of the magnetic recording medium.

To increase the recording density of a magnetic recording device, it is effective to make the magnetic fine particles of the recording medium smaller. Making the magnetic fine particles smaller, however, causes the problem that the magnetic fine particles drop in the thermal stability of magnetization. To solve this problem, it is effective to increase the anisotropic energy of the magnetic fine particles. However, increasing the anisotropic energy of the magnetic fine particles leads to an increase in coercivity of the recording medium, and this makes it difficult to perform data writing with existing magnetic heads.

To solve the foregoing problems, there has been proposed a technology so-called thermally-assisted magnetic recording. The technology uses a recording medium having high coercivity. When writing data, a write magnetic field and heat are simultaneously applied to the area of the recording medium where to write data, so that the area rises in temperature and drops in coercivity for data writing. The area where data is written subsequently falls in temperature and rises in coercivity to increase the thermal stability of magnetization. Hereinafter, a magnetic head for use in thermally-assisted magnetic recording will be referred to as a thermally-assisted magnetic recording head.

In thermally-assisted magnetic recording, near-field light is typically used as a means for applying heat to the recording medium. A known method for generating near-field light is to use a plasmon generator, which is a piece of metal that generates near-field light from plasmons excited by irradiation with laser light. The laser light to be used for generating the near-field light is typically guided through a waveguide, which is provided in the slider, to the plasmon generator disposed near a medium facing surface of the slider.

U.S. Patent Application Publication No. 2010/0290323 A1 discloses a technology for coupling the light that propagates through the waveguide with the plasmon generator in surface plasmon mode via a buffer part, thereby exciting surface plasmons on the plasmon generator.

Here, a description will be given of an example of the shape of the plasmon generator and the arrangement of the plasmon generator and the waveguide. In this example, the plasmon generator is disposed above the top surface of the core of the waveguide. The plasmon generator has an edge part facing the top surface of the core of the waveguide. A clad is disposed around the core. The clad includes a part lying between the edge part of the plasmon generator and the top surface of the core, and this part of the clad serves as the buffer part.

In the aforementioned plasmon generator, an end of the edge part located in the medium facing surface serves as a near-field light generating part. In the plasmon generator, the light that propagates through the core is totally reflected at the top surface of the core. This causes evanescent light to occur from the top surface of the core. Then, at least on the edge part of the plasmon generator, surface plasmons are excited through coupling with the foregoing evanescent light. The surface plasmons propagate along the edge part to reach the near-field light generating part, and near-field light is generated from the near-field light generating part based on the surface plasmons. Such a configuration allows the surface plasmons excited on the plasmon generator to propagate to the near-field light generating part with high efficiency.

The aforementioned configuration can be formed in the following manner. First, a layer to be etched is formed using a dielectric material that is to be employed for the clad. Part of the layer to be etched is located on the top surface of the core. Then, a groove that is V-shaped in cross section parallel to the medium facing surface (hereinafter, also referred to as V-shaped groove) is formed in the layer to be etched. This groove is formed not to reach the top surface of the core. Being provided with the groove, the layer to be etched becomes part of the clad. The plasmon generator is then formed in the groove.

In the aforementioned configuration, the V-shaped groove has two wall faces that intersect at a predetermined angle, and the plasmon generator has two inclined surfaces that are opposed to the two wall faces. The edge part of the plasmon generator is defined by the two inclined surfaces of the plasmon generator intersecting each other. The angle formed by the two inclined surfaces affects the intensity of surface plasmons excited on the plasmon generator and the spot diameter of the near-field light generated from the near-field light generating part. As the angle formed by the two inclined surfaces decreases, the edge part becomes sharper and the near-field light generated from the near-field light generating part decreases in spot diameter. To increase the intensity of the surface plasmons excited on the plasmon generator, however, it is preferred that the angle formed by the two inclined surfaces be large to some extent. This means that there is a preferred range for the angle formed by the two inclined surfaces. By way of example, the angle formed by the two inclined surfaces preferably falls within the range of 50° to 120°. The angle formed by the two inclined surfaces can be defined within the range of 50° to 120° by allowing each of the two wall faces of the V-shaped groove to form an angle (hereinafter referred to as inclination angle) within the range of 30° to 65° with respect to the top surface of the layer to be etched, and allowing the angle between the two wall faces to fall within the range of 50° to 120°.

To form the V-shaped groove in the layer to be etched which will later become part of the clad, the layer to be etched can be taper-etched by reactive ion etching (hereinafter, also referred to as RIE). Generally in this method, an etching mask made of a photoresist is provided on the layer to be etched, and this etching mask is used to taper-etch the layer to be etched. For the taper-etching by RIE, the inclination angle of the wall faces of the groove depends on the ratio between the deposition rate of a sidewall protective film that is formed by a reaction product during the etching and the etching rate.

On the other hand, $SiO_2$ (silicon dioxide) or SiON (silicon oxynitride) may be used as the material of the clad. In this case, it is required that a layer to be etched that is made of SiO$_2$ or SiON be taper-etched by RIE to form therein the V-shaped groove with the inclination angle of each of the two wall faces defined within the range of 30° to 65°. However, under the conventional RIE method using an etching mask made of a photoresist, it is difficult to accomplish the taper-etching of the layer to be etched that is made of SiO$_2$ or SiON to form therein the above-described V-shaped groove. More specifically, the conventional method can hardly form any groove or can form a bottomed groove whose two wall faces form an inclination angle of nearly 90° and do not intersect at a predetermined angle. This is presumably because the conventional method cannot form a sidewall protective film at an appropriate deposition rate during the etching.

OBJECTS AND SUMMARY OF THE INVENTION

It is a first object of the present invention to provide a taper-etching method that makes it possible to form a groove having two wall faces intersecting at a predetermined angle in a layer to be etched that is made of SiO$_2$ or SiON.

It is a second object of the present invention to provide a method of manufacturing a near-field light generator including a waveguide and a plasmon generator. The waveguide includes a core and a clad. The clad includes a clad layer having a groove located above the top surface of the core. The groove has two wall faces that intersect at a predetermined angle. The plasmon generator has two inclined surfaces opposed to the two wall faces. The method allows forming the clad layer by forming the groove in a layer to be etched that is made of SiO$_2$ or SiON.

A taper-etching method of the present invention is a method of taper-etching a layer to be etched that is made of SiO$_2$ or SiON and has a top surface. The method includes the steps of forming an etching mask on the top surface of the layer to be etched, the etching mask having an opening; and taper-etching a portion of the layer to be etched, the portion being exposed from the opening, by reactive ion etching so that a groove having two wall faces that intersect at a predetermined angle is formed in the layer to be etched. The etching mask is formed of a material containing elemental Al. The step of taper-etching employs an etching gas that contains a main component gas and N$_2$, the main component gas contributing to the etching of the layer to be etched.

A method of manufacturing a near-field light generator of the present invention is a method by which a near-field light generator including a waveguide and a plasmon generator is manufactured. The waveguide has a core through which light propagates, and a clad surrounding the core. The core has a top surface. The clad includes a clad layer that has a groove located above the top surface of the core. The groove has two wall faces that intersect at a predetermined angle. The plasmon generator has: two inclined surfaces opposed to the two wall faces; an edge part defined by the two inclined surfaces intersecting each other; and a near-field light generating part located at an end of the edge part and generating near-field light. The light propagating through the core is totally reflected at the top surface of the core, and evanescent light thereby occurs from the top surface of the core. A surface plasmon is excited on the edge part through coupling with the evanescent light, and the surface plasmon propagates along the edge part to the near-field light generating part. The near-field light generating part generates near-field light based on the surface plasmon.

The method of manufacturing the near-filed light generator of the present invention includes the steps of: forming the core; forming the clad; and forming the plasmon generator. The step of forming the clad includes the steps of: forming a layer to be etched that is made of SiO$_2$ or SiON and has a top surface; forming an etching mask on the top surface of the layer to be etched, the etching mask having an opening; and taper-etching a portion of the layer to be etched, the portion being exposed from the opening, by reactive ion etching to form the groove in the layer to be etched, so that the layer to be etched thereby becomes the clad layer. The etching mask is formed of a material containing elemental Al. The step of taper-etching employs an etching gas that contains a main component gas and N$_2$, the main component gas contributing to the etching of the layer to be etched.

In the taper-etching method and the method of manufacturing the near-field light generator of the present invention, the material used to form the etching mask may contain at least one of an Al-containing alloy, Al$_2$O$_3$, AlN, and AlF. The main component gas may contain Cl$_2$ and BCl$_3$. The ratio of the N$_2$ flow rate to the total flow rate of the etching gas may be 10% to 20%. Each of the two wall faces may form an angle in the range of 30° to 65° with respect to the top surface of the layer to be etched. The opening may have a minimum width in the range of 0.15 to 0.5 μm.

According to the taper-etching method of the present invention, during the etching of the layer to be etched, elemental Al in the etching mask and N$_2$ in the etching gas produce a reaction product AlN, which forms a sidewall protective film. The present invention thus allows forming a groove having two wall faces that intersect at a predetermined angle in a layer to be etched that is made of SiO$_2$ or SiON.

According to the method of manufacturing the near-field light generator of the present invention, the aforementioned operation allows forming the clad layer by forming a groove having two wall faces that intersect at a predetermined angle in a layer to be etched that is made of SiO$_2$ or SiON.

Other and further objects, features and advantages of the present invention will appear more fully from the following description.

BRIEF DESCRIPTION OF THE DRAWINGS

FIG. 1 is a front view showing part of the medium facing surface of a thermally-assisted magnetic recording head of an embodiment of the invention.

DETAILED DESCRIPTION OF THE PREFERRED EMBODIMENT

Figure 2:
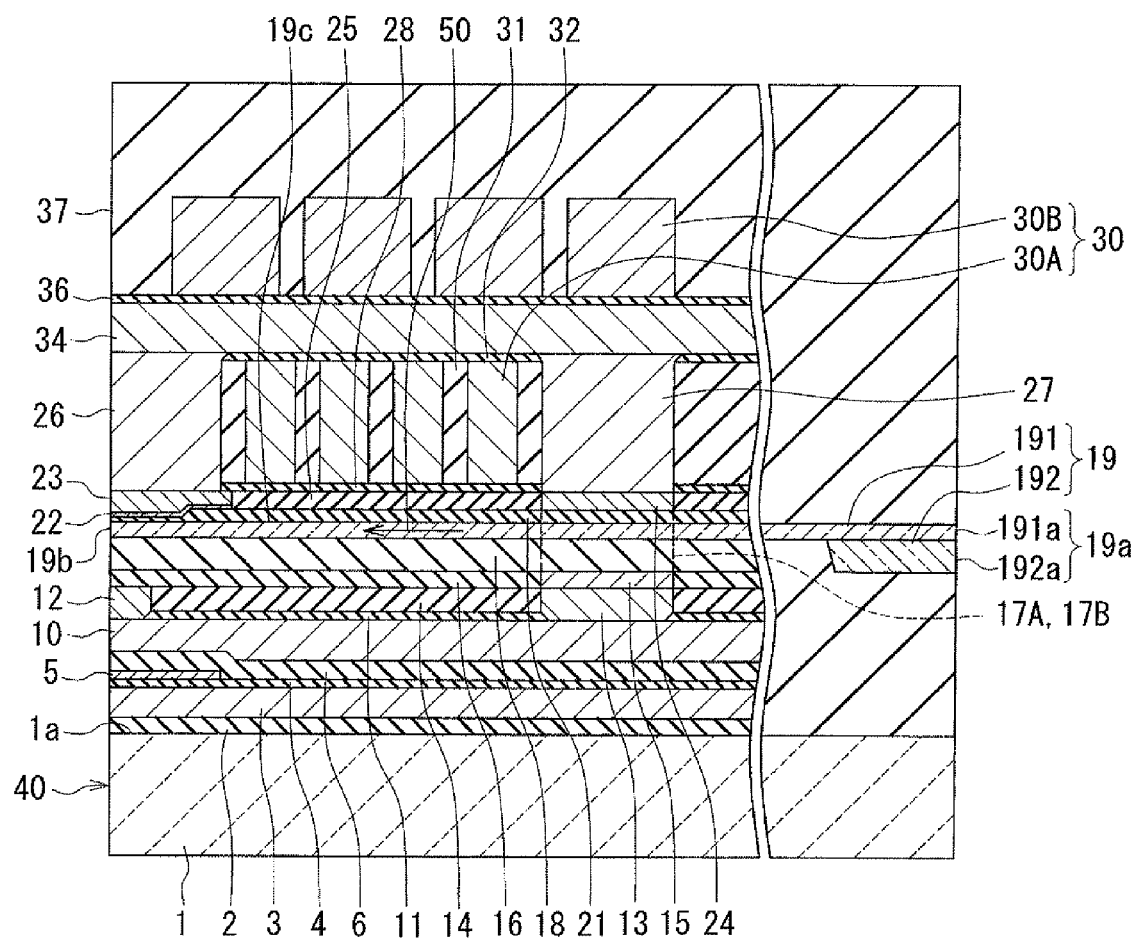
FIG. 2 is a cross-sectional view showing the configuration of the thermally-assisted magnetic recording head of the embodiment of the invention.
Figure 3:
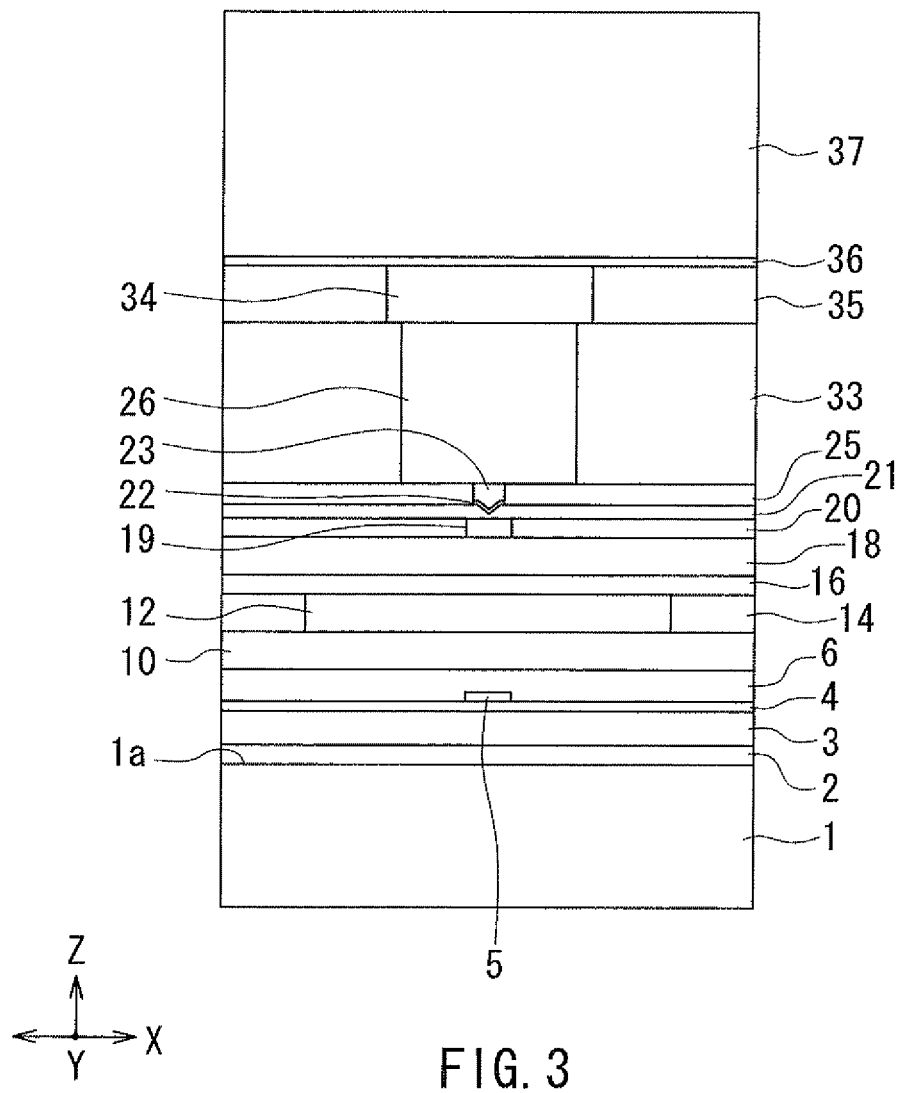
FIG. 3 is a front view showing the medium facing surface of the thermally-assisted magnetic recording head of the embodiment of the invention.

A preferred embodiment of the present invention will now be described in detail with reference to the drawings. First, reference is made to FIG. 1 to FIG. 3 to describe the configuration of a thermally-assisted magnetic recording head of the embodiment of the invention. FIG. 1 is a front view showing part of the medium facing surface of the thermally-assisted magnetic recording head. FIG. 2 is a cross-sectional view showing the configuration of the thermally-assisted magnetic recording head. FIG. 3 is a front view showing the medium facing surface of the thermally-assisted magnetic recording head.

The thermally-assisted magnetic recording head of this embodiment is for use in perpendicular magnetic recording, and is in the form of a slider to fly over the surface of a recording medium that rotates. When the recording medium rotates, an airflow passing between the recording medium and the slider causes a lift to be exerted on the slider. The slider is configured to fly over the surface of the recording medium by means of the lift.

As shown in FIG. 2, the thermally-assisted magnetic recording head has a medium facing surface 40 that faces the recording medium. Here, X direction, Y direction, and Z direction will be defined as follows. The X direction is the direction across the tracks of the recording medium, i.e., the track width direction. The Y direction is a direction perpendicular to the medium facing surface 40. The Z direction is the direction of travel of the recording medium as viewed from the slider. The X, Y, and Z directions are orthogonal to one another.

As shown in FIG. 2 and FIG. 3, the thermally-assisted magnetic recording head includes: a substrate 1 made of a ceramic material such as aluminum oxide-titanium carbide ($Al_2O_3$—TiC) and having a top surface 1a; an insulating layer 2 made of an insulating material and disposed on the top surface 1a of the substrate 1; and a bottom shield layer 3 made of a magnetic material and disposed on the insulating layer 2. The insulating layer 2 is made of alumina ($Al_2O_3$), for example. The Z direction is also a direction perpendicular to the top surface 1a of the substrate 1.

The thermally-assisted magnetic recording head further includes: a bottom shield gap film 4 which is an insulating film disposed on the top surface of the bottom shield layer 3; a magnetoresistive (MR) element 5 serving as a read element disposed on the bottom shield gap film 4; two leads (not shown) connected to the MR element 5; and a top shield gap film 6 which is an insulating film disposed on the MR element 5.

An end of the MR element 5 is located in the medium facing surface 40 facing the recording medium. The MR element 5 may be an element made of a magneto-sensitive film that exhibits a magnetoresistive effect, such as an anisotropic magnetoresistive (AMR) element, a giant magnetoresistive (GMR) element, or a tunneling magnetoresistive (TMR) element. The GMR element may be of either the current-in-plane (CIP) type in which a current used for detecting magnetic signals is fed in a direction generally parallel to the plane of layers constituting the GMR element or the current-perpendicular-to-plane (CPP) type in which the current used for detecting magnetic signals is fed in a direction generally perpendicular to the plane of layers constituting the GMR element.

The thermally-assisted magnetic recording head further includes: a return pole layer 10 made of a magnetic material and disposed on the top shield gap film 6; a not-shown insulating layer disposed around the return pole layer 10 on the top shield gap film 6; and an insulating layer 11 disposed on part of the top surface of the return pole layer 10. The not-shown insulating layer and the insulating layer 11 are made of alumina, for example.

The thermally-assisted magnetic recording head further includes: a shield layer 12 made of a magnetic material and disposed on the return pole layer 10 in the vicinity of the medium facing surface 40; a coupling layer 13 made of a magnetic material and disposed on the return pole layer 10 at a position that is farther from the medium facing surface 40 than is the position of the shield layer 12; and an insulating layer 14 disposed around the shield layer 12 and the coupling layer 13. The shield layer 12 has an end face located in the medium facing surface 40. The insulating layer 14 is made of alumina, for example.

The thermally-assisted magnetic recording head further includes a coupling layer 15 made of a magnetic material and disposed on the coupling layer 13, and an insulating layer 16 disposed over the shield layer 12 and the insulating layer 14 and surrounding the coupling layer 15. The insulating layer 16 is made of alumina, for example. The top surfaces of the coupling layer 15 and the insulating layer 16 are even with each other.

The thermally-assisted magnetic recording head further includes a waveguide having a core 19 and a clad. The clad surrounds the core 19 and includes clad layers 18, 20, and 21. The clad layer 18 lies over the coupling layer 15 and the insulating layer 16. The core 19 is disposed on the clad layer 18. The clad layer 20 lies on the clad layer 18 and surrounds the core 19. The top surfaces of the core 19 and the clad layer 20 are even with each other. The clad layer 21 lies over the core 19 and the clad layer 20.

The core 19 has an incidence part 19a, an end face 19b closer to the medium facing surface 40, and a top surface 19c. The end face 19b may be located in the medium facing surface 40 or at a distance from the medium facing surface 40. FIG. 1 to FIG. 3 show an example where the end face 19b is located in the medium facing surface 40.

The core 19 includes a first layer 191 and a second layer 192. The first layer 191 includes the aforementioned end face 19b and top surface 19c, and has a bottom surface. The first layer 191 extends in a direction perpendicular to the medium facing surface 40 (the Y direction). The second layer 192 is disposed along the bottom surface of the first layer 191 and bonded to the bottom surface. The first layer 191 has an incidence end face 191a that constitutes a portion of the incidence part 19a. The second layer 192 has an incidence end face 192a that constitutes another portion of the incidence part 19a. Laser light emitted from a not-shown laser diode is incident on the incidence part 19a and propagates through the core 19. The clad layers 18, 20 and 21 are each formed of a dielectric material that has a refractive index lower than that of the core 19. For example, the core 19 can be formed of tantalum oxide such as $Ta_2O_5$, or of SiON. If tantalum oxide is employed as the material of the core 19, the clad layers 18, 20 and 21 may be formed of $SiO_2$ or SiON, for example. If SiON is employed as the material of the core 19, the clad layers 18, 20 and 21 may be formed of $SiO_2$, for example.

As shown in FIG. 1, the clad layer 21 has a top surface 21a, and a groove 21b located above the top surface 19c of the core 19. The groove 21b is V-shaped in cross section parallel to the medium facing surface 40. The groove 21b has two wall faces 21b1 and 21b2 that intersect at a predetermined angle. The groove 21b has a bottom edge that faces the top surface 19c of the core 19 with a predetermined gap therebetween and that extends in the direction perpendicular to the medium facing surface 40 (the Y direction). Here, as shown in FIG. 1, the angle formed by the two wall faces 21b1 and 21b2 will be denoted with symbol $\theta 1$. The angle $\theta 1$ preferably falls within the range of 50° to 120°, for example. On the other hand, the angle that each of the two wall faces 21b1 and 21b2 forms with respect to the top surface 21a of the clad layer 21 will be referred to as inclination angle and denoted with symbol $\theta 2$. The inclination angle $\theta 2$ preferably falls within the range of 30° to 65°, for example. The reason for setting the inclination angle $\theta 2$ to fall within the range of 30° to 65° will be explained in detail later. The depth (the dimension in the Z direction) of the groove 21b will be denoted with symbol H. The depth H preferably falls within the range of 0.05 to 0.3 µm, for example.

The thermally-assisted magnetic recording head further includes a plasmon generator 22 and a main pole 23. The plasmon generator 22 is disposed above the top surface 19c of the core 19 in the vicinity of the medium facing surface 40. The main pole 23 is made of a magnetic material and disposed such that the plasmon generator 22 is interposed between the core 19 and the main pole 23. At least part of the plasmon generator 22 is accommodated in the groove 21b of the clad layer 21. The plasmon generator 22 is made of a metal. More specifically, the plasmon generator 22 is made of, for example, one of Au, Ag, Al, Cu, Pd, Pt, Rh and Ir, or of an alloy composed of two or more of these elements. A detailed description will be made later as to the shape of the plasmon generator 22 and the main pole 23.

The thermally-assisted magnetic recording head further includes two coupling portions 17A and 17B embedded in the clad layers 18, 20 and 21 at positions away from the medium facing surface 40. The coupling portions 17A and 17B are made of a magnetic material. The coupling portions 17A and 17B are located on opposite sides of the core 19 in the track width direction (the X direction), each being spaced from the core 19. Although not shown, each of the coupling portions 17A and 17B includes a first layer located on the coupling layer 15, and a second layer and a third layer stacked in this order on the first layer.

The thermally-assisted magnetic recording head further includes a coupling layer 24 made of a magnetic material and disposed on the coupling portions 17A and 17B, and an insulating layer 25 disposed around the main pole 23 and the coupling layer 24 on the clad layer 21. The insulating layer 25 is made of alumina, for example. The top surfaces of the main pole 23, the coupling layer 24 and the insulating layer 25 are even with each other.

The thermally-assisted magnetic recording head further includes a coupling layer 26 made of a magnetic material and disposed on the main pole 23, and a coupling layer 27 made of a magnetic material and disposed on the coupling layer 24.

Figure 4:
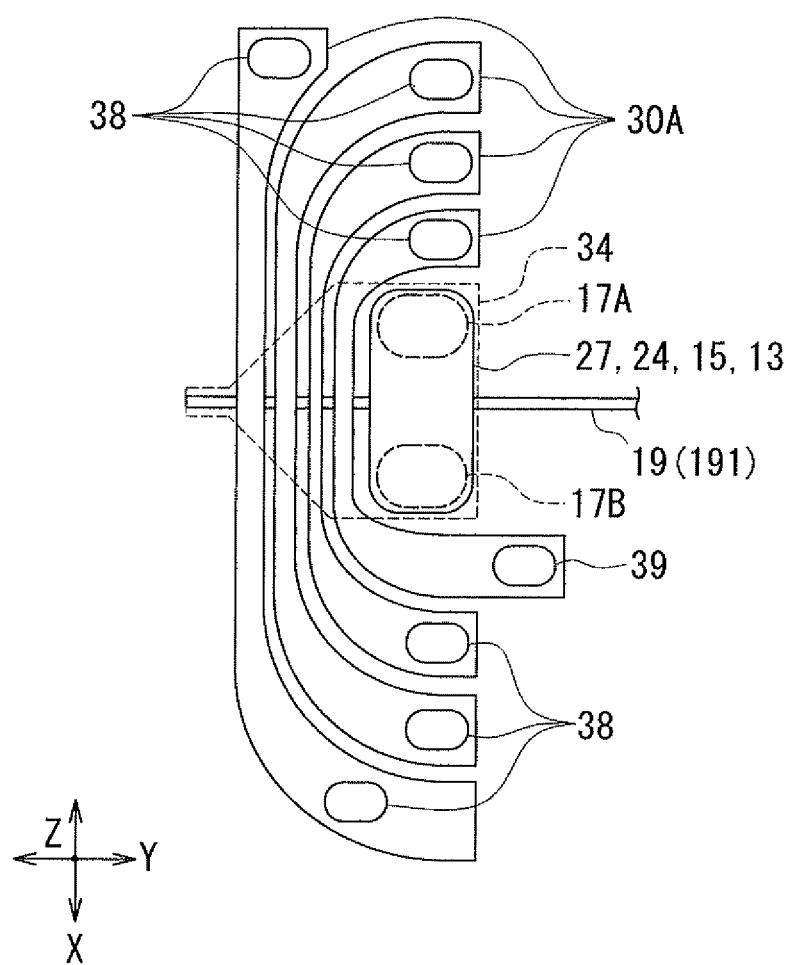
FIG. 4 is a plan view showing a first layer of a coil of the thermally-assisted magnetic recording head of the embodiment of the invention.

The thermally-assisted magnetic recording head further includes an insulating layer 28 disposed on the insulating layer 25, a plurality of first coil elements 30A disposed on the insulating layer 28, an insulating layer 31 disposed around the plurality of first coil elements 30A, an insulating layer 32 disposed to cover the plurality of first coil elements 30A and the insulating layer 31, and an insulating layer 33 disposed around the coupling layers 26 and 27 and the insulating layer 31. FIG. 4 shows the plurality of first coil elements 30A. The plurality of first coil elements 30A are arranged side by side in the Y direction. Each first coil element 30A has a main part extending in the track width direction (the X direction). Each first coil element 30A is made of a conductive material such as copper. The insulating layers 28 and 31 to 33 are made of alumina, for example.

The thermally-assisted magnetic recording head further includes a yoke layer 34 made of a magnetic material and disposed over the coupling layers 26 and 27 and the insulating layer 32, and an insulating layer 35 disposed around the yoke layer 34. The yoke layer 34 magnetically couples the coupling layer 26 to the coupling layer 27. The insulating layer 35 is made of alumina, for example. The top surfaces of the yoke layer 34 and the insulating layer 35 are even with each other.

The thermally-assisted magnetic recording head further includes: an insulating layer 36 disposed over the yoke layer 34 and the insulating layer 35; a plurality of second coil elements 30B and a lead layer 30C disposed on the insulating layer 36; and a protection layer 37 disposed to cover the plurality of second coil elements 30B and the lead layer 30C. The insulating layer 36 and the protection layer 37 are made of alumina, for example.

Figure 5:
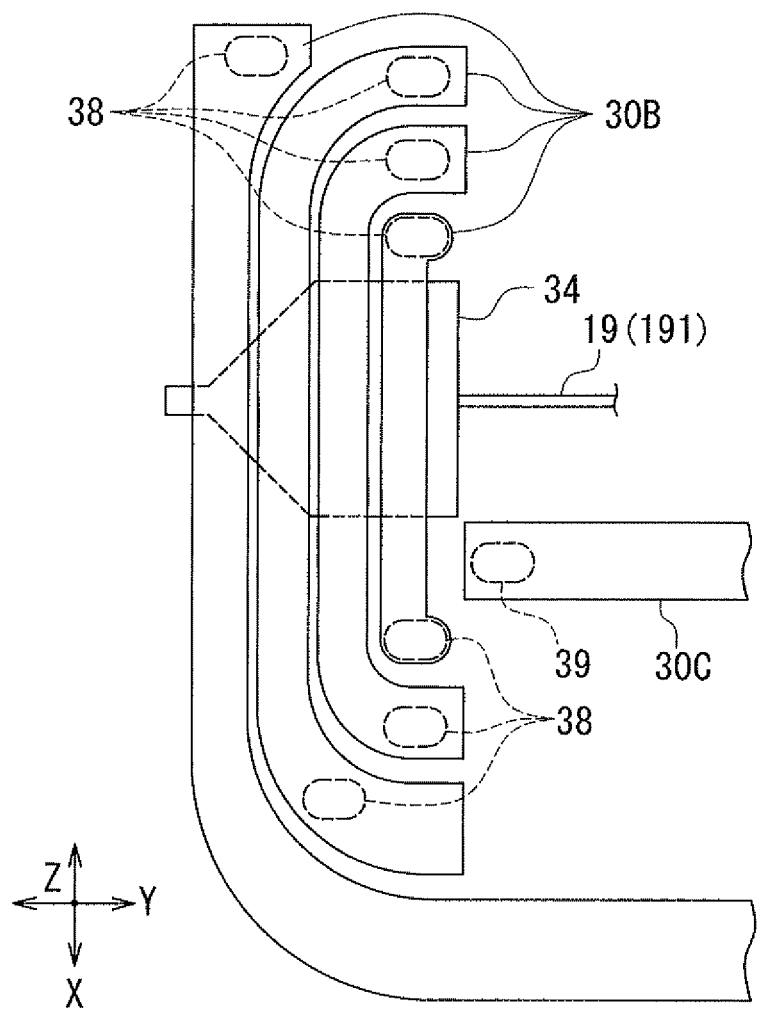
FIG. 5 is a plan view showing a second layer of the coil of the thermally-assisted magnetic recording head of the embodiment of the invention.

FIG. 5 shows the plurality of second coil elements 30B and the lead layer 30C. The plurality of second coil elements 30B are arranged side by side in the Y direction. Each second coil element 30B has a main part extending in the track width direction (the X direction). Each second coil element 30B and the lead layer 30C are made of a conductive material such as copper.

As shown in FIG. 4 and FIG. 5, the thermally-assisted magnetic recording head further includes a plurality of connection parts 38 and a single connection part 39. The plurality of connection parts 38 connect the plurality of first coil elements 30A to the plurality of second coil elements 30B so as to form a coil 30 wound helically around the yoke layer 34. The connection part 39 connects one of the first coil elements 30A to the lead layer 30C. The connection parts 38 and the connection part 39 are provided to penetrate through the insulating layers 32, 35 and 36. The connection parts 38 and the connection part 39 are each made of a conductive material such as copper.

The parts from the bottom shield layer 3 to the return pole layer 10 constitute a read head. The parts from the return magnetic pole layer 10 to the plurality of second coil elements 30B constitute a write head. The coil 30 is composed of the plurality of first coil elements 30A, the plurality of second coil elements 30B, and the plurality of connection parts 38. The coil 30 produces a magnetic field corresponding to data to be written on the recording medium. The shield layer 12, the return pole layer 10, the coupling layers 13 and 15, the coupling portions 17A and 17B, the coupling layers 24 and 27, the yoke layer 34, the coupling layer 26, and the main pole 23 form a magnetic path for passing a magnetic flux corresponding to the magnetic field produced by the coil 30. The main pole 23 allows the magnetic flux corresponding to the magnetic field produced by the coil 30 to pass, and produces a write magnetic field for writing data on the recording medium by means of a perpendicular magnetic recording system.

As has been described, the thermally-assisted magnetic recording head of this embodiment includes the medium facing surface 40, the read head, and the write head. The medium facing surface 40 faces the recording medium. The read head and the write head are stacked on the substrate 1. Relative to the read head, the write head is located forward along the direction of travel of the recording medium (the Z direction) (i.e., located on the trailing side).

The read head includes the MR element 5 serving as a read element, and the bottom shield layer 3 and a top shield layer for shielding the MR element 5. The bottom shield layer 3 and the top shield layer have their respective portions that are located near the medium facing surface 40 and opposed to each other with the MR element 5 therebetween. In this embodiment, the return pole layer 10 of the write head also serves as the top shield layer of the read head. The read head further includes the bottom shield gap film 4 disposed between the MR element 5 and the bottom shield layer 3, and the top shield gap film 6 disposed between the MR element 5 and the return pole layer 10.

The write head includes the coil 30, the main pole 23, the waveguide, and the plasmon generator 22. The waveguide has the core 19 and the clad. The clad includes the clad layers 18, 20, and 21. The coil 30 produces a magnetic field corresponding to data to be written on the recording medium. The main pole 23 allows a magnetic flux corresponding to the magnetic field produced by the coil 30 to pass, and produces a write magnetic field for writing data on the recording medium by means of the perpendicular magnetic recording system.

The near-field light generator according to this embodiment includes the waveguide having the core 19 and the clad, and the plasmon generator 22. The core 19 has the top surface 19c and propagates laser light emitted from a not-shown laser diode. The clad includes the clad layer 21 having the groove 21b located above the top surface 19c of the core 19. The groove 21b has the two wall faces 21b1 and 21b2 that intersect at a predetermined angle $\theta 1$. At least part of the plasmon generator 22 is located in the groove 21b.

Now, with reference to FIG. 1, an example of the shape of the plasmon generator 22 and the main pole 23 will be described in detail below. In the example shown in FIG. 1, the plasmon generator 22 has two inclined surfaces 22a and 22b, an edge part 22e, and a near-field light generating part 22g. The two inclined surfaces 22a and 22b are opposed to the two wall faces 21b1 and 21b2 of the groove 21b of the clad layer 21. The edge part 22e is defined by the two inclined surfaces 22a and 22b intersecting each other. The near-field light generating part 22g lies at an end of the edge part 22e and generates near-field light. The edge part 22e faces the top surface 19c of the core 19 with a predetermined gap therebetween, and extends in the direction perpendicular to the medium facing surface 40 (the Y direction). The near-field light generating part 22g is located in the medium facing surface 40. The angle formed by the two inclined surfaces 22a and 22b is equal to the angle $\theta 1$ formed by the two wall faces 21b1 and 21b2 of the groove 21b.

The plasmon generator 22 further has a sidewall part 221A including the inclined surface 22a, a sidewall part 221B including the inclined surface 22b, and extended portions 222A and 222B that are coupled to the top ends of the sidewall parts 221A and 221B, respectively. The sidewall parts 221A and 221B and the extended portions 222A and 222B are each plate-shaped. The sidewall part 221A is disposed along the wall face 21b1 of the groove 21b. The sidewall part 221B is disposed along the wall face 21b2 of the groove 21b. The extended portions 222A and 222B are disposed along the top surface 21a of the clad layer 21. The extended portion 222A extends from the top end of the sidewall part 221A in a direction away from both the sidewall parts 221A and 221B. The extended portion 222B extends from the top end of the sidewall part 221B in a direction away from both the sidewall parts 221A and 221B.

The main pole 23 includes a first portion 231 and a second portion 232. The first portion 231 is accommodated in the space defined by the two sidewall parts 221A and 221B of the plasmon generator 22. The second portion 232 is located farther from the core 19 than is the first portion 231. In FIG. 1, the border between the first portion 231 and the second portion 232 is shown by chain double-dashed lines.

The shape and arrangement of the plasmon generator 22 and the main pole 23 are not limited to the foregoing example that has been described with reference to FIG. 1.

Now, the principle of generation of near-field light in this embodiment and the principle of thermally-assisted magnetic recording using the near-field light will be described in detail. Laser light emitted from a not-shown laser diode is incident on the incidence part 19a of the core 19. As shown in FIG. 2, the laser light 50 propagates through the core 19 toward the medium facing surface 40, and reaches the vicinity of the plasmon generator 22. The laser light 50 is then totally reflected at the top surface 19c of the core 19. This causes evanescent light to occur from the top surface 19c to permeate into the clad layer 21. As a result, surface plasmons are excited at least on the edge part 22e in the plasmon generator 22 through coupling with the evanescent light.

The surface plasmons excited on the plasmon generator 22 propagate along the edge part 22e to the near-field light generating part 22g. Consequently, the surface plasmons concentrate at the near-field light generating part 22g, and near-field light occurs from the near-field light generating part 22g based on the surface plasmons. The near-field light is projected toward the recording medium, reaches the surface of the recording medium and heats a part of the magnetic recording layer of the recording medium. This lowers the coercivity of the part of the magnetic recording layer. In thermally-assisted magnetic recording, the part of the magnetic recording layer with the lowered coercivity is subjected to a write magnetic field produced by the main pole 23 for data writing.

Now, with reference to FIG. 2 and FIG. 3, a description will be given of a method of manufacturing the thermally-assisted magnetic recording head of this embodiment. The method of manufacturing the thermally-assisted magnetic recording head of this embodiment includes the steps of forming components of a plurality of thermally-assisted magnetic recording heads other than the substrates 1 on a substrate that includes portions to become the substrates 1 of the plurality of thermally-assisted magnetic recording heads, thereby fabricating a substructure that includes rows of a plurality of pre-head portions that are to later become the plurality of thermally-assisted magnetic recording heads; and forming the plurality of thermally-assisted magnetic recording heads by cutting the substructure to separate the plurality of pre-head portions from each other. In the step of forming the plurality of thermally-assisted magnetic recording heads, the cut surfaces are polished into the medium facing surfaces 40.

The method of manufacturing the thermally-assisted magnetic recording head of this embodiment will now be described in more detail with attention focused on a single thermally-assisted magnetic recording head. In the method of manufacturing the thermally-assisted magnetic recording head of this embodiment, the insulating layer 2 is formed on the substrate 1 first. Next, the bottom shield layer 3 is formed on the insulating layer 2. Next, the bottom shield gap film 4 is formed on the bottom shield layer 3. Next, the MR element 5 and not-shown two leads connected to the MR element 5 are formed on the bottom shield gap film 4. Next, the top shield gap film 6 is formed to cover the MR element 5 and the leads.

Next, the return pole layer 10 is formed on the top shield gap film 6. Next, a not-shown insulating layer is formed to cover the return pole layer 10. The not-shown insulating layer is then polished by, for example, chemical mechanical polishing (hereinafter referred to as CMP), until the return pole layer 10 is exposed. Then, the insulating layer 11 is formed on part of the top surface of the return pole layer 10.

Next, the shield layer 12 and the coupling layer 13 are formed on the return pole layer 10. Next, the insulating layer 14 is formed to cover the shield layer 12 and the coupling layer 13. The insulating layer 14 is then polished by, for example, CMP, until the shield layer 12 and the coupling layer 13 are exposed.

Next, the coupling layer 15 is formed on the coupling layer 13. Next, the insulating layer 16 is formed to cover the coupling layer 15. The insulating layer 16 is then polished by, for example, CMP, until the coupling layer 15 is exposed. The top surfaces of the coupling layer 15 and the insulating layer 16 are thereby made even with each other.

Next, the respective first layers of the coupling portions 17A and 17B are formed on the coupling layer 15. The clad layer 18 is then formed to cover the respective first layers of the coupling portions 17A and 17B. The clad layer 18 is then polished by, for example, CMP, until the respective first layers of the coupling portions 17A and 17B are exposed.

Next, the core 19 is formed on the clad layer 18. The respective second layers of the coupling portions 17A and 17B are formed on the respective first layers of the coupling portions 17A and 17B. The clad layer 20 is then formed to cover the core 19 and the respective second layers of the coupling portions 17A and 17B. The clad layer 20 is then polished by, for example, CMP, until the core 19 and the respective second layers of the coupling portions 17A and 17B are exposed.

Next, the respective third layers of the coupling portions 17A and 17B are formed on the respective second layers of the coupling portions 17A and 17B. The clad layer 21, the plasmon generator 22, and the main pole 23 are then formed in this order. The plasmon generator 22 is formed by initially forming a metal film by, for example, sputtering, and then patterning the metal film. The main pole 23 is formed by plating, for example. The step of forming the clad layer 21 will be described in detail later.

Next, the coupling layer 24 is formed over the respective third layers of the coupling portions 17A and 17B. Next, the insulating layer 25 is formed to cover the main pole 23 and the coupling layer 24. The insulating layer 25 is then polished by, for example, CMP, until the main pole 23 and the coupling layer 24 are exposed.

Next, the insulating layer 28 is formed over the main pole 23, the coupling layer 24 and the insulating layer 25. The plurality of first coil elements 30A are then formed on the insulating layer 28. Next, the insulating layer 31 is formed around the first coil elements 30A. The insulating layer 32 is then formed to cover the plurality of first coil elements 30A and the insulating layer 31. Next, the insulating layers 28, 31 and 32 are selectively etched to form therein openings for exposing the top surface of the main pole 23 and openings for exposing the top surface of the coupling layer 24. Then, the coupling layer 26 is formed on the main pole 23, and the coupling layer 27 is formed on the coupling layer 24. Next, the insulating layer 33 is formed to cover the coupling layers 26 and 27. The insulating layer 33 is then polished by, for example, CMP, until the coupling layers 26 and 27 are exposed.

Next, the insulating layer 32 is selectively etched to form therein a plurality of openings for passing portions of the connection parts 38 and 39. The connection parts 38 and 39 are then formed to be connected to the plurality of first coil elements 30A through the plurality of openings. The yoke layer 34 is formed over the coupling layers 26 and 27 and the insulating layer 32. Next, the insulating layer 35 is formed to cover the yoke layer 34 and the connection parts 38 and 39. The insulating layer 35 is then polished by, for example, CMP, until the yoke layer 34 and the connection parts 38 and 39 are exposed. Next, the insulating layer 36 is formed over the yoke layer 34, the insulating layer 35 and the connection parts 38 and 39.

Next, the insulating layer 36 is selectively etched to form therein a plurality of openings for exposing the top surfaces of the connection parts 38 and 39. The plurality of second coil elements 30B and the lead layer 30C are then formed on the insulating layer 36 and the connection parts 38 and 39. Next, the protection layer 37 is formed to cover the plurality of second coil elements 30B and the lead layer 30C. Wiring, terminals, and other components are then formed on the top surface of the protection layer 37.

When the substructure is completed thus, the substructure is cut to separate the plurality of pre-head portions from each other, and then polishing of the medium facing surface 40, fabrication of flying rails, and other processing are performed to complete the thermally-assisted magnetic recording head.

Now, the method of manufacturing the near-field light generator according to the embodiment will be described. The method of manufacturing the near-field light generator according to the embodiment includes the steps of forming the core 19; forming the clad; and forming the plasmon generator 22. The step of forming the clad includes the steps of forming the clad layer 18; forming the clad layer 20; and forming the clad layer 21.

Reference is now made to FIG. 6 to FIG. 10 to describe the step of forming the clad layer 21. In this embodiment, the clad layer 21 is formed of $SiO_2$ or SiON. The following includes the description of the taper-etching method according to the embodiment. FIG. 6 to FIG. 10 each show a cross section of a stack of layers formed in the process of manufacturing the near-field light generator, the cross section being taken in the position where the medium facing surface 40 is to be formed.

Figure 6:
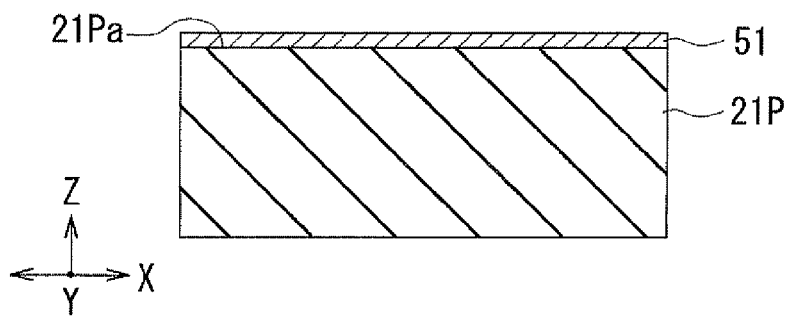
FIG. 6 is a cross-sectional view showing a step of a method of manufacturing a near-field light generator according to the embodiment of the invention.

FIG. 6 shows a step that follows the formation of the respective third layers of the coupling portions 17A and 17B. In this step, a layer to be etched 21P is formed first. The layer to be etched 21P is made of $SiO_2$ or SiON. The layer to be etched 21P is formed by initially forming a dielectric layer of $SiO_2$ or SiON to cover the top surface 19c of the core 19, the top surface of the clad layer 20 and the respective third layers of the coupling portions 17A and 17B, and then polishing the dielectric layer by, for example, CMP, until the respective third layers of the coupling portions 17A and 17B are exposed. In the layer to be etched 21P, the groove 21b which is V-shaped in cross section parallel to the medium facing surface 40 is to be formed later, which will make the layer to be etched 21P into the clad layer 21. The layer to be etched 21P has a top surface 21Pa. On the top surface 21Pa of the layer to be etched 21P, a stopper film 51 of Ru is formed. Note that any of magnetic materials, Ni, NiCr, C, MgF, and MgO may be employed instead of Ru.

Figure 7:
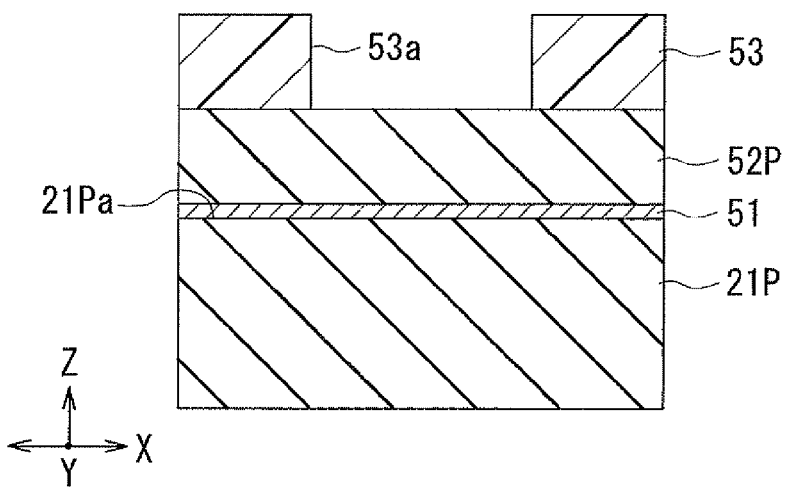
FIG. 7 is a cross-sectional view showing a step that follows the step shown in FIG. 6.

FIG. 7 shows the next step. In this step, first, an etching mask material layer 52P is formed on the top surface of the stopper film 51. The etching mask material layer 52P is formed of a material containing elemental Al. The material used to form the etching mask material layer 52P may contain at least one of an Al-containing alloy, alumina ($Al_2O_3$), aluminum nitride (AlN), and aluminum fluoride (AlF), for example. If alumina is employed as the material of the etching mask material layer 52P, the etching mask material layer 52P is formed to have a thickness in the range of 0.05 to 0.3 μm, for example.

Next, a photoresist mask 53 is formed on the top surface of the etching mask material layer 52P. The photoresist mask 53 has an opening 53a that has a shape corresponding to the planar shape of the groove 21b to be formed later. The photoresist mask 53 is formed by patterning a photoresist layer by photolithography.

Figure 8:
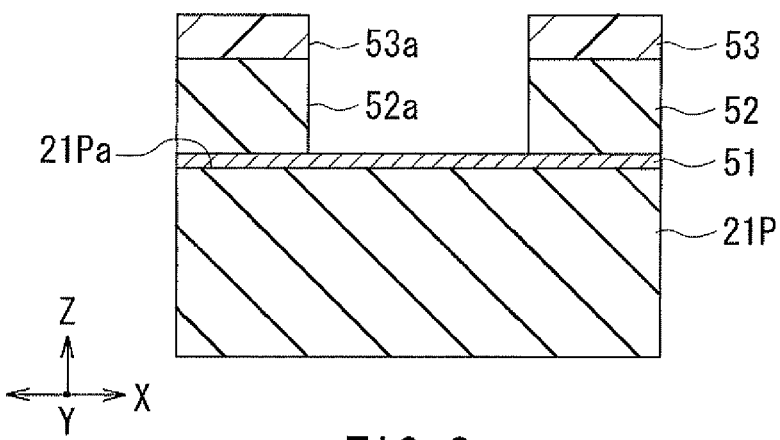
FIG. 8 is a cross-sectional view showing a step that follows the step shown in FIG. 7.

FIG. 8 shows the next step. In this step, using the photoresist mask 53 as the etching mask, part of the etching mask material layer 52P exposed from the opening 53a is etched by reactive ion etching (hereinafter referred to as RIE), for example. This provides the etching mask material layer 52P with an opening 52a having a shape corresponding to the planar shape of the groove 21b to be formed later. The etching mask material layer 52P thereby becomes an etching mask 52.

If the etching mask material layer 52P is made of alumina, a gas containing $Cl_2$ and $BCl_3$, for example, is used as the etching gas when etching the etching mask material layer 52P by RIE. The stopper film 51 functions as the etching stopper that stops etching when the etching mask material layer 52P is etched by RIE.

The minimum width (critical dimension) of the opening 52a is the width in the X direction, and falls within the range of 0.15 to 0.5 μm, for example. If the etching mask material layer 52P is made of alumina, the thicker the etching mask material layer 52P, the less controllable the minimum width of the opening 52a becomes. It is therefore preferable that the thickness of the etching mask material layer 52P be 0.3 μm or less. However, it is not always required that the thickness of the etching mask material layer 52P be 0.3 μm or less.

If the etching mask material layer 52P is made of alumina and has a thickness of 0.1 μm or less, ion beam etching (hereinafter referred to as IBE) may be employed to etch the etching mask material layer 52P to form the opening 52a therein.

Figure 9:
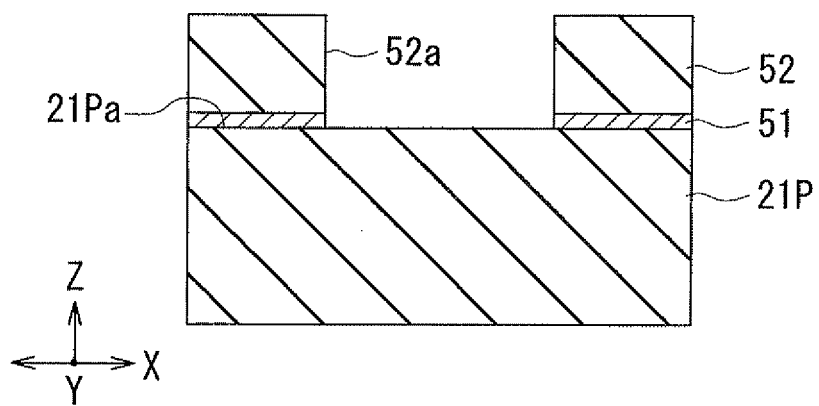
FIG. 9 is a cross-sectional view showing a step that follows the step shown in FIG. 8.

FIG. 9 shows the next step. In this step, first, part of the stopper film 51 exposed from the openings 52a and 53a is etched away by, for example, IBE or RIE using the etching mask 52 and the photoresist mask 53 as the etching mask. Next, the photoresist mask 53 is removed by wet etching or ashing. If the stopper film 51 is made of Ru, a gas containing $O_2$ and $Cl_2$, for example, is used as the etching gas when etching the stopper film 51 by RIE. If the etching mask material layer 52P is made of alumina and has a thickness of 0.1 μm or less, the stopper film 51 may be etched by IBE simultaneously with the etching of the etching mask material layer 52P.

Figure 10:
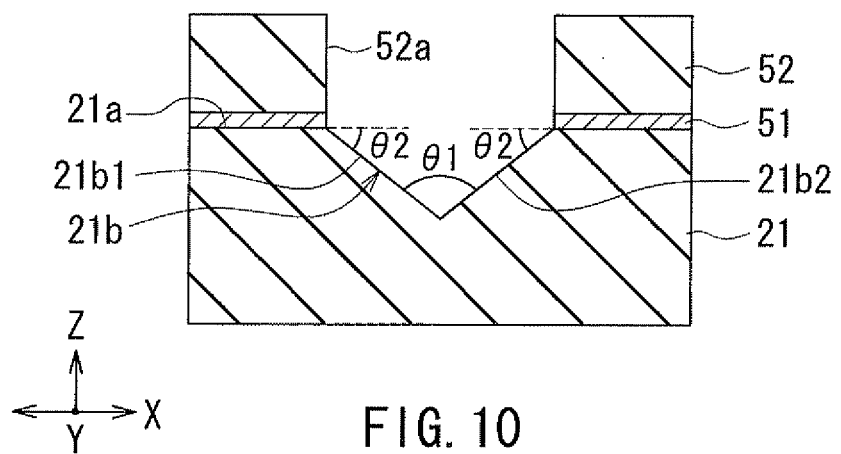
FIG. 10 is a cross-sectional view showing a step that follows the step shown in FIG. 9.

FIG. 10 shows the next step. In this step, first, the groove 21b is formed in the layer to be etched 21P so that the layer to be etched 21P becomes the clad layer 21. In the step of forming the groove 21b, part of the layer to be etched 21P exposed from the opening 52a is taper-etched by RIE using the etching mask 52 as the etching mask. The stopper film 51 and the etching mask 52 are then removed.

The step of taper-etching the layer to be etched 21P by RIE uses an etching gas that contains a main component gas and $N_2$, the main component gas contributing to the etching of the layer to be etched 21P. The main component gas may contain $Cl_2$ and $BCl_3$. $N_2$ is used for forming, during the etching of the layer to be etched 21P, a sidewall protective film on the sidewall of the groove to be formed by the etching. The sidewall protective film is formed as follows. Part of the etching mask 52 is etched along with the layer to be etched 21P. As described above, the etching mask 52 is made of a material containing elemental Al. Consequently, during the etching of the layer to be etched 21P, elemental Al in the etching mask 52 and $N_2$ in the etching gas produce a reaction product AlN. The reaction product AlN adheres to the wall face of the groove formed in the layer to be etched 21P to form the sidewall protective film. The formation of the sidewall protective film serves to accomplish the taper-etching of the layer to be etched 21P.

In the step of taper-etching the layer to be etched 21P by RIE, each of the two wall faces 21b1 and 21b2 of the groove 21b is created to form an inclination angle θ2 with respect to the top surface 21Pa of the layer to be etched 21P (the top surface 21a of the clad layer 21). In this manner, there is formed the groove 21b which is V-shaped in cross section parallel to the medium facing surface 40 and has the two wall faces 21b1 and 21b2 that intersect at a predetermined angle θ1. The groove 21b is formed not to reach the top surface 19c of the core 19. With the groove 21b formed therein, the layer to be etched 21P becomes the clad layer 21.

The inclination angle θ2 depends on the ratio between the deposition rate of the sidewall protective film and the etching rate. This ratio between the rates can be controlled by, for example, varying the ratio of the $N_2$ flow rate to the total flow rate of the etching gas. By controlling the ratio between the rates in this manner, the angle θ1 and the inclination angle θ2 can be controlled. For example, to make the angle θ1 be 90° and the inclination angle θ2 be 45° in the example shown in FIG. 10, the ratio of the $N_2$ flow rate to the total flow rate of the etching gas is set at 10% to 20%.

As has been described, the step of forming the clad layer 21 in the method of manufacturing the near-field light generator according to the embodiment and the taper-etching method according to the embodiment include the steps of: forming the layer to be etched 21P that is made of $SiO_2$ or SiON and has the top surface 21Pa; forming the etching mask 52, which has the opening 52a, on the top surface 21Pa of the layer to be etched 21P; and taper-etching a portion of the layer to be etched 21P, the portion being exposed from the opening 52a, by RIE to form the groove 21b in the layer to be etched 21P so that the layer to be etched 21P thereby becomes the clad layer 21. The etching mask 52 is formed of a material containing elemental Al. The step of taper-etching the layer to be etched 21P employs an etching gas containing a main component gas, which contributes to the etching of the layer to be etched 21P, and $N_2$.

According to this embodiment, during the etching of the layer to be etched 21P, elemental Al in the etching mask 52 and $N_2$ in the etching gas produce the reaction product AlN, which forms the sidewall protective film. According to this embodiment, the formation of the sidewall protective film allows forming the groove 21b, which has the two wall faces 21b1 and 21b2 intersecting at a predetermined angle θ1, in the layer to be etched 21P made of $SiO_2$ or SiON, thereby allowing the formation of the clad layer 21. According to this embodiment, in particular, it is possible to form the groove 21b such that the inclination angle θ2 formed by each of the two wall faces 21b1 and 21b2 with respect to the top surface 21Pa of the layer to be etched 21P falls within the range of 30° to 65°, and θ1 consequently falls within the range of 50° to 120°.

The angle formed by the two inclined surfaces 22a and 22b of the plasmon generator 22 affects the intensity of surface plasmons excited on the plasmon generator 22 and the spot diameter of near-field light generated from the near-field light generating part 22g. In order to increase to some extent the intensity of surface plasmons excited on the plasmon generator 22 and to decrease to some extent the spot diameter of near-field light generated from the near-field light generating part 22g, the angle formed by the two inclined surfaces 22a and 22b preferably falls within the range of 50° to 120°.

Since this embodiment allows forming the groove 21b as described above, it is possible to form the sidewall parts 221A and 221B of the plasmon generator 22 in the groove 21b of the clad layer 21 made of $SiO_2$ or SiON such that the angle formed by the two inclined surfaces 22a and 22b falls within the range of 50° to 120°. Consequently, it is possible to provide a near-field light generator configured so that the sidewall parts 221A and 221B of the plasmon generator 22 are located in the groove 21b of the clad layer 21 made of $SiO_2$ or SiON, wherein the two inclined surfaces 22a and 22b form a desired angle within the range of 50° to 120°.

Furthermore, in this embodiment, the angles θ1 and θ2 can be controlled by, for example, varying the ratio of the $N_2$ flow rate to the total flow rate of the etching gas to control the ratio between the deposition rate of the sidewall protective film and the etching rate. According to this embodiment, it is thereby possible to control the angle formed by the two inclined surfaces 22a and 22b of the plasmon generator 22.

Figure 11:
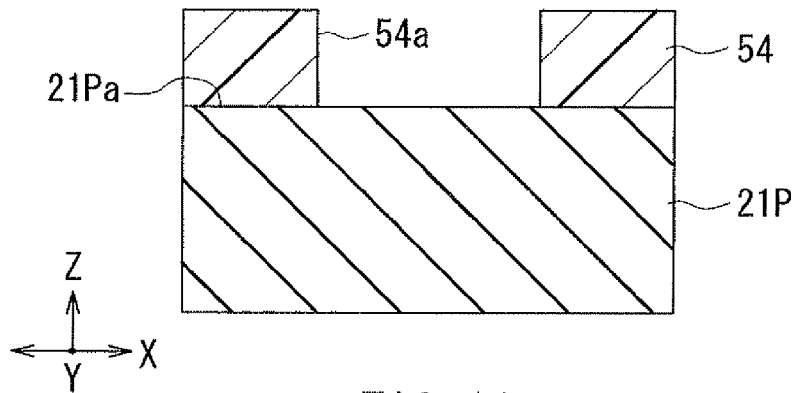
FIG. 11 is a cross-sectional view showing a step of an etching method of a comparative example.
Figure 12:
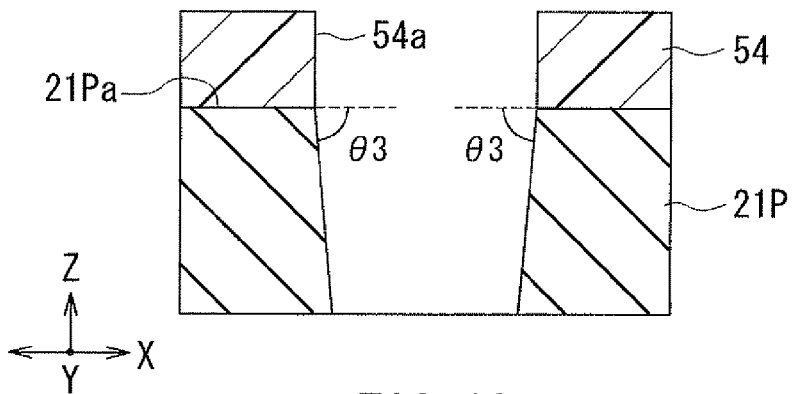
FIG. 12 is a cross-sectional view showing a first example of a step that follows the step shown in FIG. 11.
Figure 13:
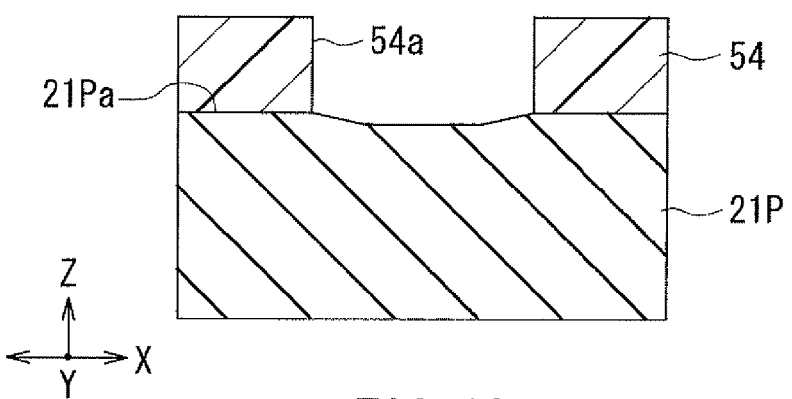
FIG. 13 is a cross-sectional view showing a second example of a step that follows the step shown in FIG. 11.

The effects of this embodiment will now be described in comparison with an etching method of a comparative example. First, the etching method of the comparative example will be described with reference to FIG. 11 to FIG. 13. FIG. 11 to FIG. 13 show a stack of layers formed by the etching method of the comparative example. FIG. 11 to FIG. 13 each show a cross section of the stack taken at the position where the medium facing surface 40 is to be formed.

FIG. 11 shows a step that follows the formation of the layer to be etched 21P. In the etching method of the comparative example, a photoresist mask 54 having an opening 54a is formed on the top surface 21Pa of the layer to be etched 21P. The photoresist mask 54 is formed by patterning a photoresist layer by photolithography.

In the etching method of the comparative example, the layer to be etched 21P is then etched by RIE using the photoresist mask 54 as the etching mask. This step will be referred to as the etching step of the comparative example. FIG. 12 shows a first example of the etching step of the comparative example. FIG. 13 shows a second example of the etching step of the comparative example.

The etching step of the comparative example uses an etching gas containing a main component gas, which contributes to the etching of the layer to be etched 21P, and $N_2$. The main component gas contains $O_2$, $C_{x1}F_{y1}$, $C_{x2}HF_{y2}$, and $CO_{x3}$ (x1, y1, x2, y2, and x3 are natural numbers). $N_2$ serves to accelerate the formation of the sidewall protective film.

In conventional RIE which employs an etching mask formed of a photoresist, $N_2$ in the etching gas is used to retard side etching. This holds also true for the etching method of the comparative example. In this case, as shown in FIG. 12, the etching step of the comparative example leads to the formation of a bottomed groove whose sidewalls form an inclination angle θ3 of nearly 90° (for example, 80°) with respect to the top surface 21Pa of the layer to be etched 21P.

On the other hand, in the etching step of the comparative example, if such etching conditions are chosen that the deposition rate of the sidewall protective film becomes higher, then the etching of the layer to be etched 21P is stopped before the groove reaches a sufficient depth, as shown in FIG. 13.

As can be seen from above, the etching step of the comparative example cannot accomplish the taper-etching of the layer to be etched 21P of $SiO_2$ or SiON in such a manner as to form the groove 21b which is V-shaped in cross section parallel to the medium facing surface 40.

In contrast to this, according to the present embodiment, the layer to be etched 21P is etched by using the etching mask 52 formed of a material containing elemental Al and using an etching gas that contains a main component gas and $N_2$. According to the embodiment, it is thus possible to form a sidewall protective film by producing the reaction product AlN at an appropriate deposition rate during the etching of the layer to be etched 21P.

Consequently, the embodiment makes it possible to easily form the groove 21b which is V-shaped in cross section parallel to the medium facing surface 40.

The present invention is not limited to the foregoing embodiment, and various modifications may be made thereto. For example, the taper-etching method of the present invention is applicable not only to the case of forming the groove 21b in the clad layer 21 to accommodate at least part of the plasmon generator 22 as in the method of manufacturing the near-field light generator of the invention, but to all cases where a layer of $SiO_2$ or SiON is to be taper-etched.

It is apparent that the present invention can be carried out in various forms and modifications in the light of the foregoing descriptions. Accordingly, within the scope of the following claims and equivalents thereof, the present invention can be carried out in forms other than the foregoing most preferable embodiment.

What is claimed is:

1. A taper-etching method for taper-etching a layer to be etched, the layer to be etched being made of $SiO_2$ or SiON and having a top surface, the taper-etching method comprising the steps of:

forming a separate etching mask on the top surface of the layer to be etched, the etching mask having an opening; and taper-etching a portion of the layer to be etched, the portion being exposed from the opening, by reactive ion etching so that a groove having two wall faces that intersect at a predetermined angle is formed in the layer to be etched, wherein:

the etching mask is formed of a material containing elemental Al;

the step of taper-etching employs an etching gas that contains a main component gas and $N_2$, the main component gas contributing to the etching of the layer to be etched; and in the step of taper-etching, the elemental Al contained in the etching mask and $N_2$ contained in the etching gas produce a reaction product AlN, and the reaction product AlN forms a sidewall protective film serving to accomplish the taper-etching of the layer to be etched.

2. The taper-etching method according to claim 1, wherein the material used to form the etching mask contains at least one of an Al-containing alloy, $Al_2O_3$, AlN, and AlF.

3. The taper-etching method according to claim 1, wherein the main component gas contains $Cl_2$ and $BCl_3$.

4. The taper-etching method according to claim 1, wherein the ratio of the $N_2$ flow rate to the total flow rate of the etching gas is 10% to 20%.

5. The taper-etching method according to claim 1, wherein each of the two wall faces forms an angle in the range of 30° to 65° with respect to the top surface of the layer to be etched.

6. The taper-etching method according to claim 1, wherein the opening has a minimum width in the range of 0.15 to 0.5 μm.

7. A method of manufacturing a near-field light generator, the near-field light generator comprising a waveguide and a plasmon generator, wherein:

the waveguide has a core through which light propagates, and a clad surrounding the core;

the core has a top surface;

the clad includes a clad layer that has a groove located above the top surface of the core;

the groove has two wall faces that intersect at a predetermined angle;

the plasmon generator has: two inclined surfaces opposed to the two wall faces; an edge part defined by the two inclined surfaces intersecting each other; and a near-field light generating part located at an end of the edge part and generating near-field light;

the light propagating through the core is totally reflected at the top surface of the core, and evanescent light thereby occurs from the top surface of the core; and a surface plasmon is excited on the edge part through coupling with the evanescent light, the surface plasmon propagates along the edge part to the near-field light generating part, and the near-field light generating part generates near-field light based on the surface plasmon, the method comprising the steps of:

forming the core;
forming the clad; and
forming the plasmon generator, wherein:

the step of forming the clad includes the steps of:
forming a layer to be etched, the layer to be etched being made of $SiO_2$ or SiON and having a top surface;

forming a separate etching mask on the top surface of the layer to be etched, the etching mask having an opening; and taper-etching a portion of the layer to be etched, the portion being exposed from the opening, by reactive ion etching to form the groove in the layer to be etched, so that the layer to be etched thereby becomes the clad layer; wherein the etching mask is formed of a material containing elemental Al;

the step of taper-etching employs an etching gas that contains a main component gas and $N_2$, the main component gas contributing to the etching of the layer to be etched; and in the step of taper-etching, the elemental Al contained in the etching mask and $N_2$ contained in the etching gas produce a reaction product AlN, and the reaction product AlN forms a sidewall protective film serving to accomplish the taper-etching of the layer to be etched.

8. The method of manufacturing the near-field light generator according to claim 7, wherein the material used to form the etching mask contains at least one of an Al-containing alloy, $Al_2O_3$, AlN, and AlF.

9. The method of manufacturing the near-field light generator according to claim 7, wherein the main component gas contains $Cl_2$ and $BCl_3$.

10. The method of manufacturing the near-field light generator according to claim 7, wherein the ratio of the $N_2$ flow rate to the total flow rate of the etching gas is 10% to 20%.

11. The method of manufacturing the near-field light generator according to claim 7, wherein each of the two wall faces forms an angle in the range of 30° to 65° with respect to the top surface of the layer to be etched.

12. The method of manufacturing the near-field light generator according to claim 7, wherein the opening has a minimum width in the range of 0.15 to 0.5 μm.

* * * * *